(12) United States Patent
Stiebig et al.

(10) Patent No.: US 6,281,561 B1
(45) Date of Patent: Aug. 28, 2001

(54) MULTICOLOR-COLOR SENSOR

(75) Inventors: Helmut Stiebig, Jülich; Dietmar Knipp, Hennef; Joachim Fölsch, Alzenau; Heribert Wagner, Jülich, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/486,208
(22) PCT Filed: Aug. 28, 1998
(86) PCT No.: PCT/DE98/02593
§ 371 Date: Feb. 22, 2000
§ 102(e) Date: Feb. 22, 2000
(87) PCT Pub. No.: WO99/12205
PCT Pub. Date: Mar. 11, 1999

(30) Foreign Application Priority Data

Aug. 28, 1997 (DE) ............................................. 197 37 561

(51) Int. Cl.$^7$ ..................... H01L 31/00; H01L 31/075; H01L 31/105; H01L 31/117

(52) U.S. Cl. .................. 257/440; 257/184; 257/458; 257/459; 257/460
(58) Field of Search .................................. 257/184, 440, 257/458, 459, 460, 461

(56) References Cited

U.S. PATENT DOCUMENTS

| | | | |
|---|---|---|---|
| 4,875,944 | * 10/1989 | Yoshida . | |
| 5,015,838 | * 5/1991 | Yamagishi et al. | 250/211 |
| 5,923,049 | * 7/1999 | Bohm et al. | 257/55 |
| 6,043,549 | * 3/2000 | Gutierrez-Aitken | 257/458 |
| 6,191,465 | * 2/2001 | Freeouf | 257/458 |

* cited by examiner

Primary Examiner—Ngân V. Ngô
(74) Attorney, Agent, or Firm—Herbert Dubno

(57) ABSTRACT

A multicolor sensor with a plurality of diode functions comprising a succession of layers with p and n doped layers. A microcrystalline layer is thus constructed from at least one of the internal contacts for contacting. According to the invention, pin, nip, npin and/or pnip structures are provided to form the diode functions.

9 Claims, 5 Drawing Sheets

MULTICOLOR-COLOR SENSOR

CROSS REFERENCE TO RELATED APPLICATIONS

This application is a national stage of PCT/DE98/02593 filed Aug. 28, 1998 and based upon German national application 197 37 561.8 of Aug. 28, 1997 under the International Convention.

FIELD OF THE INVENTION

The invention relates to a multicolor sensor and to an optoelectronic component having a multicolor sensor.

BACKGROUND OF THE INVENTION

Two-terminal components are known as state of the art. These optoelectronic components contain two contacts (terminals) between which is a p-n semiconductor structure for producing a photon current upon light impingement.

A drawback of this system is that the voltage must be switched so that red-green-blue (RGB) signals are only obtained in a sequentially timed relationship.

On the one hand, in this context, an nipin layer structure is already known from U.S. Pat. No. 5,311,047 as a photosensitive electrical component based upon amorphous silicon with two outer contacts. On the other hand DE 19613820.5-33 proposes a pin structure as a photosensitive electrical component with two outer contacts based upon amorphous silicon.

In addition as state of the art three terminal components are known. A first proposal for producing a pin/TCO/nipin structure as a three-terminal component is already published in M. Topic, F. Smole, J. Furlan, W. Kusian, J. of Non-Cryst. Solids 198–299 (1996) 1180–1184.

Here as well a disadvantage is that the voltage must be sequentially switched.

Finally, so-called charge-coupled devices (CCD) are known in which the color-Moire effect complicates digital signal acquisition.

With the mentioned structures for the formation of such two-terminal components or three-terminal components, the absorber layers of the individual diodes can be adjusted correspondingly as a function of the desired color separation. Known, vertically integrated color detectors are based upon the requirement that the voltage applied to the detector must be sequentially changed to obtain complete color information. For this purpose at least three or in most cases more switched voltages are required.

OBJECT OF THE INVENTION

It is therefore the object of the invention to provide a multicolor sensor in thin layer technology whereby a sequential alteration of the voltage applied to the detector is not required to obtain complete color information.

SUMMARY OF THE INVENTION

The object is achieved with a multicolor sensor with a multiplicity of layer sequences containing diode functions and with p-doped and n-doped layers.

The multicolor sensor has a layer sequence containing a multiplicity of diode functions whereby these diode functions are separated from one another by respective conductive contact layers whereby in consideration of an additional n/p heterotransition or p/n heterotransition only one charge carrier type is collected or injected via the inwardly lying contact (whereby for collection or injection only a single charge carrier type via the inwardly lying contact, an additional n/p or p/n heterotransition is provided).

A pin/nip, npin and/or pnip structure can form the diode functions.

An additional nonmicrocrystalline or amorphous layer, especially a ZnO layer, can be provided.

The sensor can have four contact layers for producing a RGB sensitivity.

For the case in which the inwardly lying p-layer and n-layer are neighboring without an intervening i-layer or i-layers lying between them, only a respective one of the two p-layer and n-layer is formed as microcrystalline.

The objects are so achieved according to the invention that a component is formed from a multiplicity, preferably three pieces, of layer shaped diode functions, for example, a pin diode function, nip diode function, npin diode function and/or pnip diode function which are arranged perpendicular to the light incidence direction and are connected together. More particularly the component of the invention is above all based upon amorphous silicon and its alloys, microcrystalline silicon and its alloys and, among others, transparent conductive contact layers. The layer sequences according to the invention and the component of the invention enable a simultaneous (parallel) reading of the photocurrent of the vertically integrated diodes so that at one and the same place (designated as a pixel in an array arrangement) a plurality of color signals, for example, a complete red-blue-green (RGB) signal can be detected. The spectral sensitivity of this component can be adjusted by an appropriate design of the individual diode functions by selection of certain parameters like, for example, the respective layer thicknesses, from the near ultraviolet to the near infrared range.

The invention is based upon the fact that a component can be developed which enables a vertical color detection by a three-dimensional integration whereby the complete color information of each pixel can be read in parallel. Since the diode functions which are upstream in the light incidence direction form absorbers for the diode functions lying thereunder, it is advantageous that the need for further optical filters is superfluous.

To produce, for example, a four-terminal component according to the invention, the optical absorption of the individual diodes must increase with increasing penetration depth and the wavelength of the photons of the irradiating light. The detection concept is based on the fact that in the first diode, the shortest wavelength light (for example blue light) is absorbed and in the last diode, the longest wavelength light is absorbed; this applies independently of the selected layer structure of the individual diodes (e.g. nip, nipin, npin, pinip, pnip, or pin).

In a consideration of npin diode structures or pnip diode structures, on both sides of a transparent contact layer respective doped semiconductor layers, especially p-doped or n-doped layers can be provided. Thus via the conductive contact layer, which can preferably be formed as a TCO (transparent conductive oxide) layer or as microcrystalline p-conducting or n-conducting material, only one charge carrier type can be injected or collected, since on the following p/n heterotransition or n/p heterotransition, charge carrier exchange occurs.

In the transition from a two-terminal to a four terminal component, all three RGB signals can be simultaneously read out rather than sequentially.

The multicolor sensor according to the invention and the component according to the invention has the advantage that with a vertical integration of the component and simultaneous detection of the signals to be acquired (for detection of the colors blue, green red), the color-Moire effect is avoided (as is customary in CCD camera applications by the use of spatially arranged color filters). Advantageously with the aid of a so-called one shot pickup a complete signal from the point of view of color detection is obtained which can be used for digital image processing.

BRIEF DESCRIPTION OF THE DRAWING

The invention is described in greater detail based upon the figures and examples. It shows.

SPECIFIC DESCRIPTION

Figure 1:
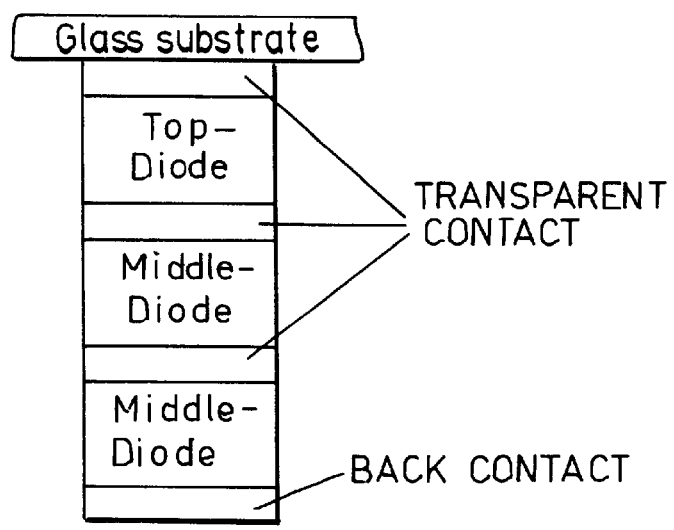
FIG. 1: a schematic illustration of the vertically integrated color detector of the invention from amorphous or microcrystalline silica with three diode functions with which the three basic colors blue, green and red can be read out in parallel.

In FIG. 1 a schematic representation of a vertically integrated color detector of amorphous or microcrystalline silicon with three diodes is shown in which the base colors (blue, green, red) can be read out in parallel.

The schematic showing of the configuration of the detector structure according to the invention shown in FIG. 1 is comprised of three diodes for generating an RGB signal and which is fabricated on a glass substrate. On the transparent front contact, which for example can be made as a ZnO layer, $SnO_2$ layer or ITO layer, a first detector structure (top diode) is deposited which absorbs blue light. Next follows the application of a further transparent contact (e.g. a ZnO layer, $SnO_2$ layer or ITO layer) upon which an also color selective diode (middle diode) is deposited. This diode detects green light. This arrangement is repeated for the third diode (bottom diode) which absorbs the long wavelength light of the spectrum (red).

Figure 2:
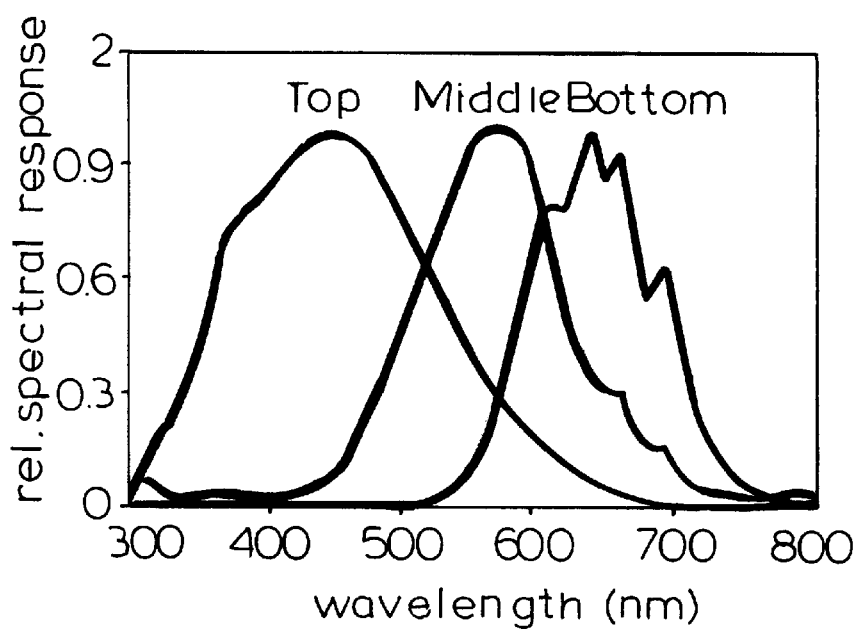
FIG. 2: a graph of relative spectral sensitivity of a four-terminal component according to the invention.

In FIG. 2 the spectral sensitivity is shown of a four-terminal component in a pin/nip/pin arrangement with the maximum spectral sensitivity of the top diode at 450 nm of the middle diode at 565 nm and of the bottom diode at 640 nm.

In the case where more than three diodes are provided the process can be correspondingly repeated. Finally the detector system is terminated with a back contact. The structuring of the multilayer structure can be effected, for example, by means of standard photolithography and refractive ion etching.

The individual diodes can be provided in an optional combination of individual diodes from the light incident direction to the rear contact. For example, for a four-terminal component, the layer structure can be for example nip/nip/nip, pin/pin/pin, pin/nip/pin, nip/pin/nip or another combination of pin/npin/npin or pin/npin/nip or the like. The spectral sensitivity of the individual diodes can be matched to the requirements by the use of material with different band gaps, the use of corresponding energy gap designs of the absorber layers (for example u-shape, v-shape gradations of the energy gap within the absorber layer like for example a-$Si_x$—$Ge_x$:H, hydrogen concentration or the use of a buffer, variation of the individual layer lengths of the active absorber layer and also of the nonactive contact layers (n-layers and p-layers).

Based upon the aforementioned optimization criteria the absorber layers of the individual diodes can be so selected that the product of layer thickness and wavelength increases with increasing wavelength from the light in an incident direction to the rear contact in the respective successive layers.

The optoelectronic characteristics of the layer sequences of the invention, the sensors or the components can be varied based upon the following criteria:

a) Incorporation of Germanium or carbon in the amorphous silicon network (a-SiGe:H, a-Si(C):H);

b) Addition of hydrogen or variation of the hydrogen concentration in the process gases for a-Si:H as well as for its alloys (point a);

c) Incorporation of microcrystalline layers based on silicon and germanium.

d) Incorporation of layer with hydrogen dilution and low deposition temperature (Ts=120°–160° C.).

The influences of the fabrication conditions on the transport characteristics of a-Si:H based alloys in the framework of the invention is described. With amorphous silicon (a-Si:H) the optoelectronic characteristics can be influenced by variation of the manufacturing conditions. For example, the material qualities can be altered by variation of the deposition pressure, the temperature, the supplied electric power or by appropriate supplying of additional process gases (like for example hydrogen, helium, argon or fluorine, in the layer deposition. This means that the charge carrier transport characteristics (i.e. the product of charge carrier life and charge carrier mobility as well as the ambipolar deformation length) can be adjusted in a targeted manner over a certain range.

Within increasing germanium content, the optical band spacing can be continuously adjusted between $E_G \approx 1.8$ eV (a-Si:H) and $E_G \approx 1.0$ eV (a-Ge:H) with increasing Ge concentration, the defect density increases as determined by the "constant photo current method" measuring process up to about two orders of magnitude.

Moreover, with silicon alloying (as with a-Si:H) by preparative techniques, especially by the supply of additional process gases during deposition, the transport characteristics can be influenced. Material produced with strong-hydrogen dilution shows a substantially greater photoconductivity and thus higher values for the $\mu\tau$ product by comparison with material deposited without $H_2$ addition. This effect increases with increasing carbon content in the material. $[H_2]/([SiH_4]+[CH_4])$ can then assume values of 10 to 50.

A further possibility within the framework of the invention is to produce materials with greater band gaps and good optoelectronic characteristics by the use of higher hydrogen dilution (preferably 4 to 30 times) and a lower deposition temperature (preferably at temperature in the range of 120° C. to 160° C.). Under these deposition conditions, an energy band gap in accordance with the invention in the range between 1.8 eV and 1.95 eV can be set.

By the use of microcrystalline contact layers (n-layers and p-layers) optionally partly or completely, the TCO layers between the individual diodes (e.g. pin/TCO/pin/TCO/pin) can be omitted since they afford a significantly higher conductivity and require a significantly greater etching rate (for example by reactive ion etching) than a-Si:H layers.

Figure 3:
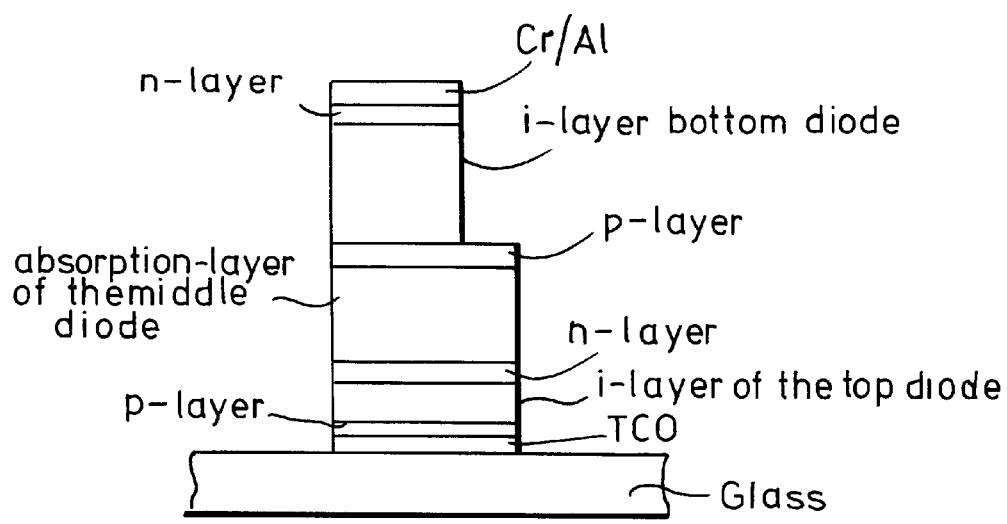
FIG. 3: a schematic structure of a four-terminal component according to the invention on the basis of a pinipin structure with microcrystalline contact layers.
Figure 5:
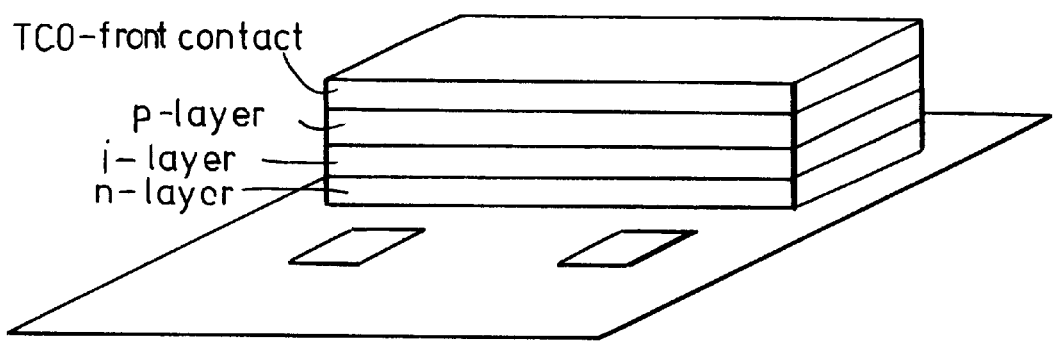
FIG. 5: schematic illustration of a diode function configured as a TCO/pin structure for the detection of red light.
Figure 6:
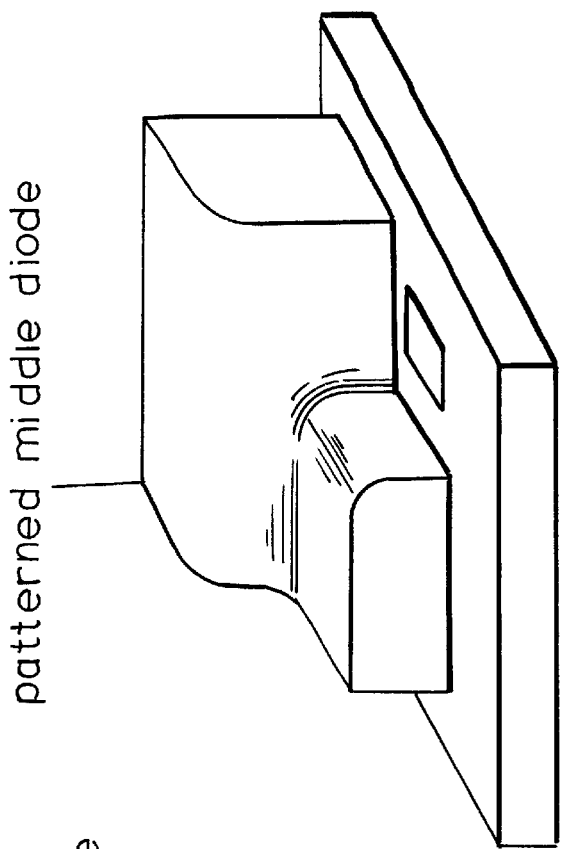
FIG. 6: a schematic illustration of a middle diode and a bottom diode for the simultaneous detection of red and green light.

Such an arrangement according to the invention, as the pinipin structure shown in FIG. 3 with microcrystalline contact layers, provides for the possibility of contacting the individual diodes. As can be deduced from FIG. 3, the inner lying layers are partly liberated by appropriate structuring to form the inner contact (terminal) and to enable contacting. Thin film structures can be realized and the thin film component structured based upon the different selectivities of microcrystalline and amorphous silicon during the etching process. These structures in the arrangement proposed in FIG. 1 have the advantage that the TCO layers can be eliminated and thus the number of doped layers reduced. As a result a simplification of the fabrication can be obtained. Expensive multiterminal structures, with complex layer sequences, like, for example, nipin or pinip diodes embedded between the transparent contacts, do indeed allow the detection of independent linear spectral gradients which are required for a further processing but the component cannot be read out in parallel so that while one has n ≧3 diodes, the adjustable spectral sensitivity of one diode is application specific. Depending upon the use, therefore, the spectral sensitivity must be correspondingly adjusted. During a read out cycle it must be ensured that one can read out an RGB signal without altering the voltage applied at the detector.

As an example, it is considered that the middle diode of a four terminal component is realized as a pinip structure. This structure can be selected based on the use to have a positive or negative voltage. The process of parallel readout is independent thereof. Such a structure has, in addition to an adjustable green sensitivity a further optimization possibility. By the additionally introduced layers the degree of freedom in the design of the structure can allow the spectral sensitivity to be better matched to a standard RGB signal. This possibility lies in the range of optical matching and the exclusion of certain spectral ranges of the incident light.

As an alternative to a detector structure according to the invention with a conductive transparent front contact which has been deposited on a glass substrate, the multilayer system can also be deposited in an inverted manner on different substrates (e.g. Ag, Al, or a silicon wafer which, e.g. contains the readout electronic circuitry).

Within the scope of the invention, for example the detector system can be deposited on an electronic circuit of a crystalline silicon base which is separated by a structure insulator from the thin film detector system.

By a targeted arrangement of the diode functions contained in a layer sequence within a sensitive array, sensor fields can be vertically integrated (in the incident light direction) which permits image acquisition free from the color-Moiré effect. Such a color sensor system according to the invention, for example on the basis of a pin/nip/pin structure or an nip/pin/nip structure, can be formed by successive depositions and structuring of the individual partial diodes on a finished electronic circuit.

In this way, with the aid of such an arrangement according to the invention, sensors can be produced with a pixel pitch of only several microns with a high surface coverage factor.

In subsequent examples of the sensor of the invention, the contacting is effected at a terminal between the top diode and the middle diode or between the middle diode and bottom diode at the doped n-conducting or p-conducting layers of the diode structure. More particularly, this contacting is described in greater detail in connection with the example of a three-color sensor for the detection of blue, green and red light.

The production of the individual diode functions of the multicolor sensor according to the invention utilizes for example the application of transparent conductive oxide layers of for example ZnO as etch stop for the structuring of the thin film system. In this case, the structuring of a diode can be ensured with only a photolithographic step. A schematic illustration of the succession of the process steps for producing such a component is illustrated in the following FIGS. 4–9 and described in greater detail below.

Figure 4:
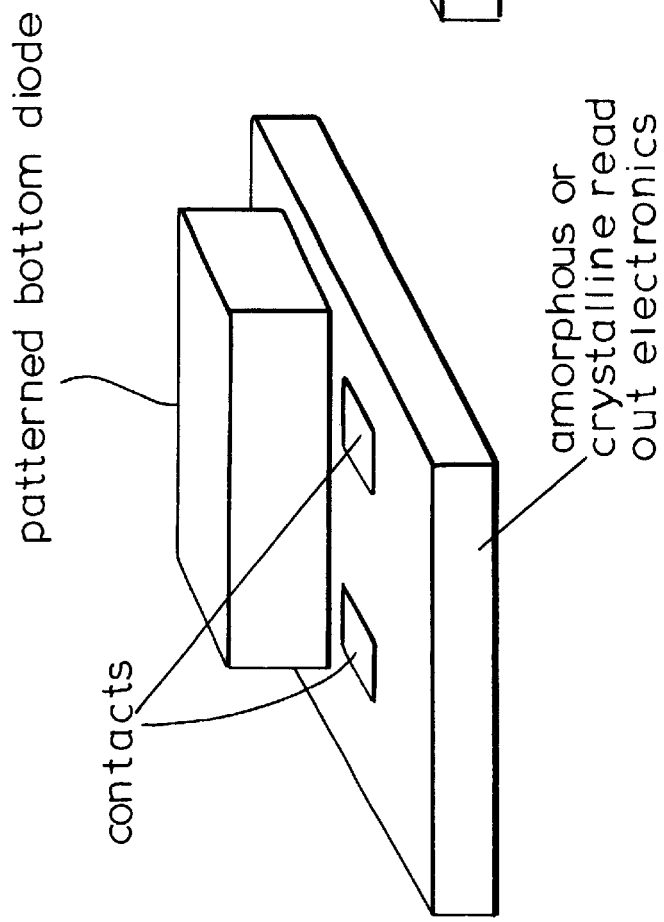
FIG. 4: a schematic illustration of a structured diode function for detection of red light.

For forming a bottom diode, initially a large area thin film system (for example a pin structure) for the detection of the red spectral component of visible light, is deposited and then structured (FIG. 4). The contacting of the back side of the bottom diode is effected via a metal contact which defines the surface of the bottom diode or also above the doped layer.

In a further step, the sidewalls of the bottom diode are provided with an insulating layer (for example silicon oxide or, in the alternative, silicon nitride ($SiO_x$, $SiN_x$ or polyamide. In this manner, coupling and leakage currents are limited when at a later point further diode arrangements are applied. For the production of the detector as well as of the insulating layer, respective photolithographic steps are used.

As an alternative to this procedure, through the use of an additional TCO layer on the diode arrangement as an etch stop, one lithographic step per diode is eliminated. In this case, after the deposition of the amorphous diode structure, for example large area ZnO is applied by sputtering. The system TCO/pin diode is completely structured (FIG. 5) and then the insulating layer is deposited. By means of selective ion etching, the insulating material is structured without the use of a further lithographic step, i.e. the sidewalls of the diode function remain insulated while in all other regions the insulating layer is stripped away.

In a further step, a large area middle diode is deposited for the detection of the green light. In that case, the doped layer, which is directly deposited on the ASIC is configured as a contact forming layer (contact layer) to serve as a connection between the middle diode and the bottom diode is microcrystalline. This is followed as well by a structuring (FIG. 6) and an insulation of the sidewalls.

The production of the top diode for the production of blue light is effected by the aforementioned steps in a comparable way. For contacting the upper layer a metal grid serves to contact the top contact.

Figure 8:
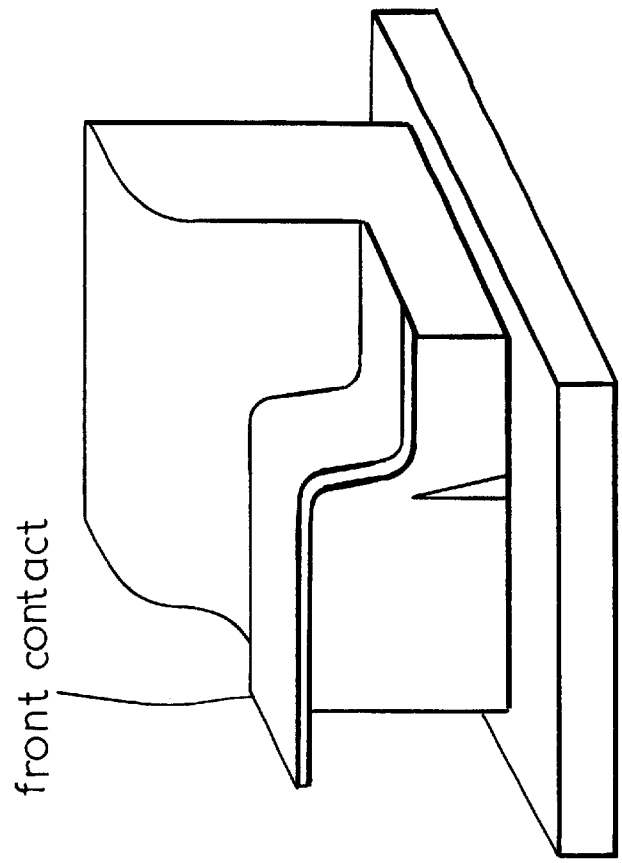
FIG. 8: the contacting of the front contact with simultaneous masking of the regions in which no complete red-green-blue (RGB) signals are enabled.
Figure 7:
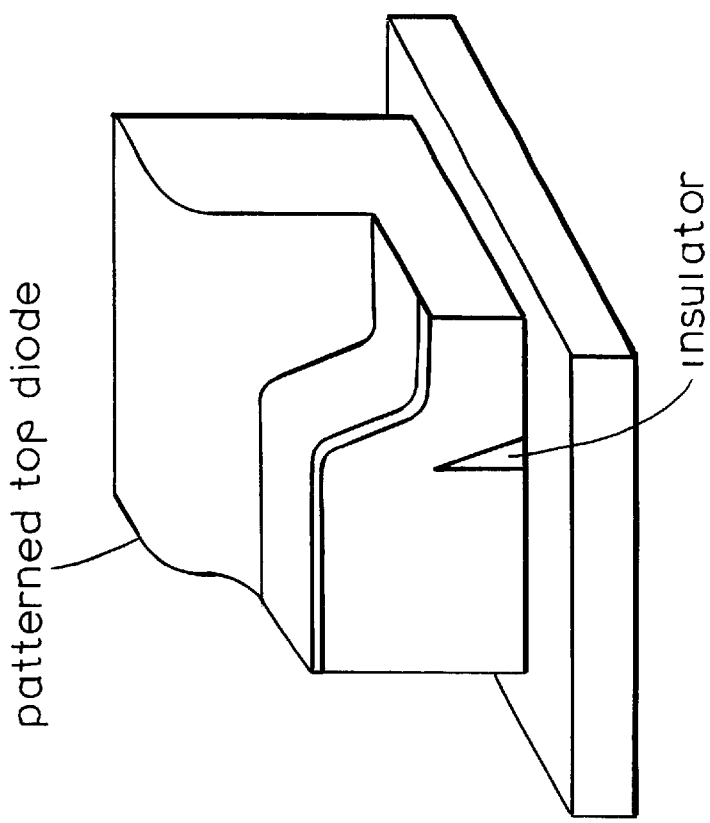
FIG. 7: a schematic illustration of a top diode, a middle diode and a bottom diode.
Figure 9:
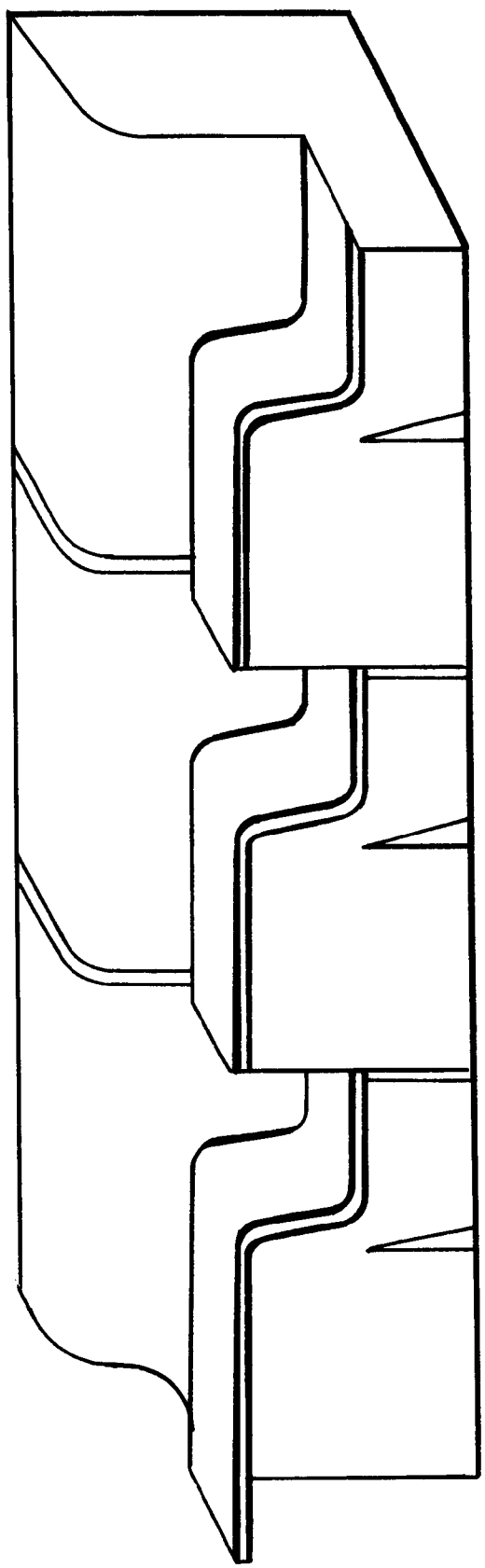
FIG. 9: a line or row array according to the invention.

Based upon the proposition that this metal guide forms discrete connections in the region it hinders absorption of light in these regions (FIG. 8). In this way it is ensured that only in the regions where the top diode, middle diode and bottom diode are arranged one above the other, is an RGB signal detected. If one arranges a multiplicity of sensors one after the other, the pixels of a column or line of a line sensor or second array can be connected together through the metal grid which can especially be in the form of an aluminum grid. (FIG. 9).

With this arrangement the individual diode functions can be vertically integrated in a selfcontacting manner.

What is claimed is:

1. A four-contact multicolor sensor comprising:
   a transparent front contact turned toward an incident light source;
   a first diode function of microcrystalline or amorphous silicon following said transparent front contact and structured to absorb short wavelengths of said incident light;
   a second diode function of microcrystalline or amorphous silicon following said first diode function and structured to absorb intermediate wavelengths of said incident light;
   a third diode function of microcrystalline or amorphous silicon following said second diode function and structured to absorb long wavelengths of said incident light, said first, second and third diode functions being integrated into a stack with further contacts between said first diode function and said second diode function and between said second diode function and said third diode function, each of said diode functions including a p-i-n or n-i-p sequence; and
   a back contact following said third diode function whereby three color signals can be read out in parallel across said contacts.

2. The four-contact multicolor sensors defined in claim 1 whereby the diode functions are separated from one another by n/p or p/n heterotransitions at which only one charge carrier type is collected or injected by a respective one of said contacts.

3. The sensor defined in claim 1 wherein a TCO layer forms each of said further contacts.

4. The sensor defined in claim 1 wherein a pin/nip, pin and/or pip structure forms the diode functions.

5. The sensor defined in claim 1, further comprising a further nonmicrocrystalline or amorphous layer.

6. The sensor defined in claim 5 wherein the additional layer is a ZnO layer.

7. The sensor defined in claim 1 wherein at least one of said further contacts is formed by a microcrystalline layer.

8. The sensor defined in claim 1 wherein said first diode function is responsive to blue, said second diode function is responsive to green and said third diode function is responsive to red and said sensor is a RGD sensor for a pixel in a two-dimensional array of stacks of said first, second and third diode functions.

9. A video camera with a CCD composed of at least one array as defined in claim 8.

* * * * *